United States Patent [19]
Kapral

[11] Patent Number: 4,468,653
[45] Date of Patent: Aug. 28, 1984

[54] CHARGE REDISTRIBUTION MU-LAW PCM DECODER

[75] Inventor: Christopher W. Kapral, San Carlos, Calif.

[73] Assignee: GTE Network Systems Incorporated, Phoenix, Ariz.

[21] Appl. No.: 558,565

[22] Filed: Dec. 5, 1983

Related U.S. Application Data

[63] Continuation-in-part of Ser. No. 307,823, Oct. 2, 1981, abandoned.

[51] Int. Cl.³ .......................................... H03K 13/17
[52] U.S. Cl. ..................... 340/347 DA; 340/347 M; 340/347 C; 340/347 AD; 370/7
[58] Field of Search ... 340/347 M, 347 AD, 347 DA, 340/347 C; 375/30; 370/7

[56] References Cited

U.S. PATENT DOCUMENTS 3,541,446  9/1968  Prozeller ................. 340/347 NT X

OTHER PUBLICATIONS

Tsividis et al., A Segmented U-255 Law PCM Voice Encoder . . . , IEEE Journal of Solid-State Circuits, vol. SC-11, No. 6, 12/1976, pp. 740-747.

Caves et al., A PCM Voice Codec with On-Chip Filters, IEEE Journal of Solid-State Circuits, vol. SC-14, No. 1, 2/1979, pp. 65-73.

Haque et al., A Two Chip PCM Voice Codec with Filters, IEEE Journal of Solid-State Circuits, vol. SC-14, No. 6, 12/1979, pp. 961-969.

*Primary Examiner*—T. J. Sloyan
*Attorney, Agent, or Firm*—Russell A. Cannon

[57] ABSTRACT

An integratable PCM decoder requiring a total capacitance of only 32 times the normalized capacitance Co of the smallest capacitor thereof. The decoder comprises a source of positive and negative reference voltages, a differential input operational amplifier having its non-inverting input connected to ground, a storage capacitor CO=16Co connected as a feedback capacitor between the inverting input and the output terminals of the amplifier so that they operate as a voltage source, binary weighted capacitors C1=Co, C2=Co, C3=4Co and C4=8Co, and a second unit weighted capacitor C5=Co. In a mu-law decoder, switch means alternately connect one and other sides of ones of C1-C5 (1) between ground and either a±reference voltage or ground, in accordance with the characterizations in a PCM coded digital input word, and (2) across the storage capacitor CO for redistributing charge on the capacitors for each segment of a designated polarity. In an A-law decoder, the switch means alternately connects one and other sides of ones of C1-C5 (1) between ground and either a±reference voltage or ground, in accordance with the characterizations in a PCM coded digital input word, for sampling charge, and (2) between one side of CO and ground for transferring charge to CO for the first segment associated with a PCM word, and across the storage capacitor CO for redistributing charge on the capacitors for other segments of a designated polarity. The resultant analog signal established on CO in the eighth segment is sampled prior to resetting the charge voltage on CO to substantially zero volts and receipt of the next PCM input word. Connections of plates of integrated capacitors and electrodes of switching transistors to ground and terminals of voltages sources renders the decoder substantially insensitive to stray and parasitic capacitance effects associated with the integrated capacitors and switches.

41 Claims, 13 Drawing Figures

(MU-LAW DECODER 10)

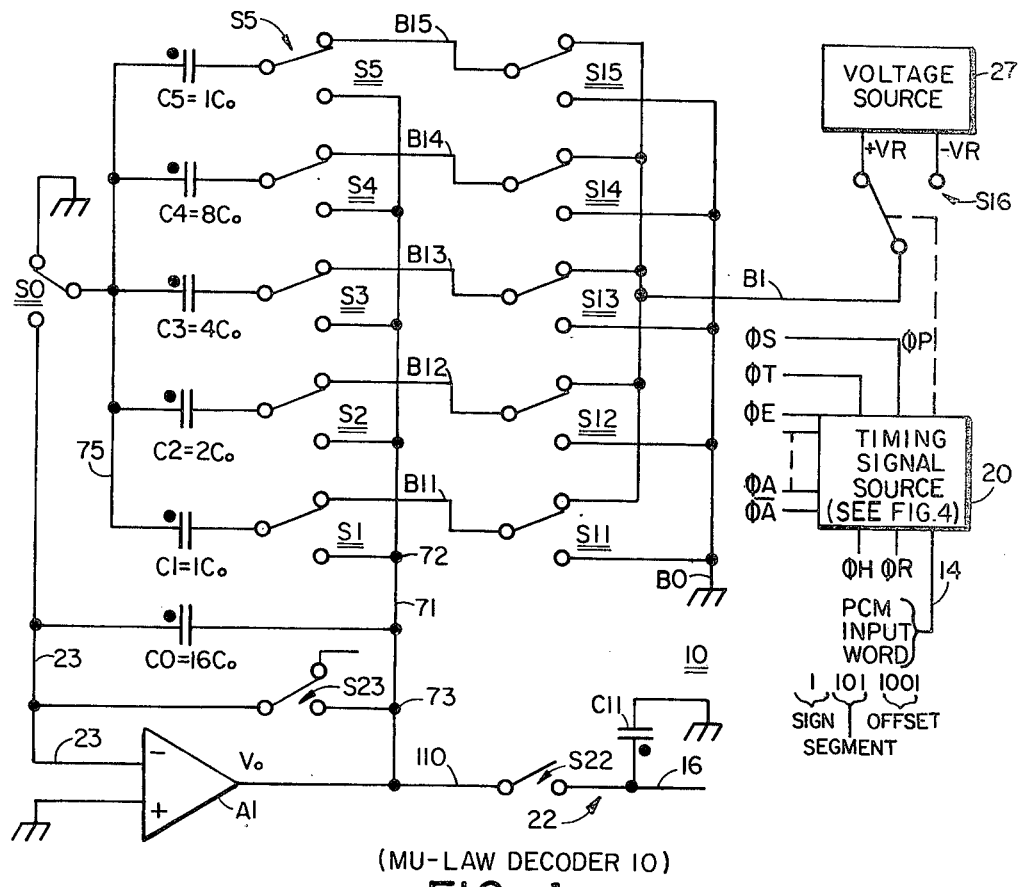
FIG. 1 (MU-LAW DECODER 10)
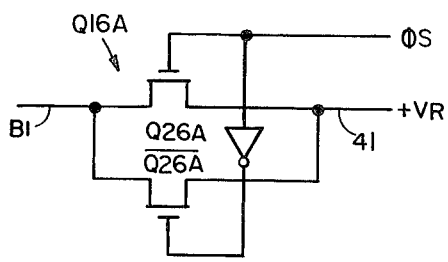
FIG. 3
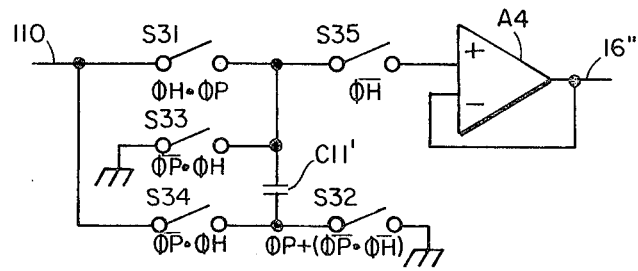
FIG. 11

(MU-LAW DECODER 10)

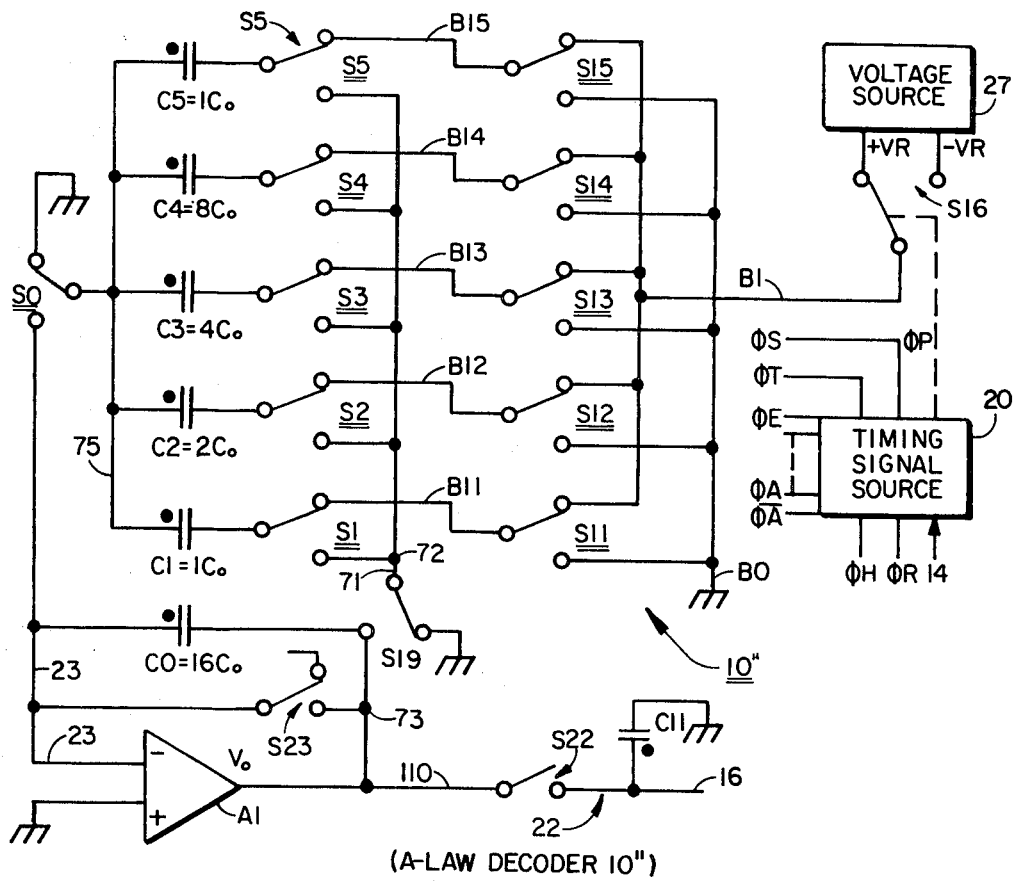
FIG. 8 (A-LAW DECODER 10")
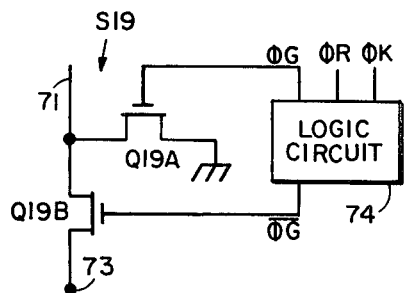
FIG. 9
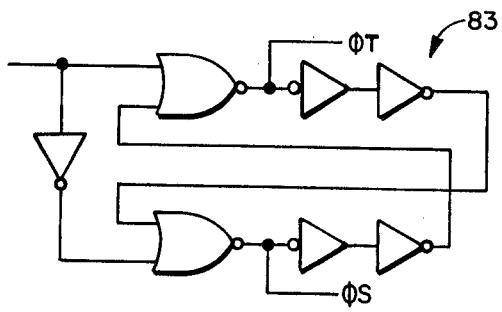
FIG. 6

4,468,653

CHARGE REDISTRIBUTION MU-LAW PCM DECODER

RELATED APPLICATION

This is a continuation-in-part of Ser. No. 307,823, filed Oct. 2, 1981, now abandoned.

BACKGROUND OF INVENTION

This invention relates to method and apparatus for decoding PCM digital input words and more particularly to an integrated PCM decoder with reduced capacitor area and that is substantially insensitive to parasitic and stray capacitance effects.

PCM encoders and/or decoders are described in the articles "A Two-Chip PCM Voice Codec With Filters" by Y. A. Hakque, et al., IEEE Journal of Solid State Circuits, Vol. SC-14, No. 6, pages 961–969, December 1979; "A PCM Voice Codec With On-Chip Filters" by J. T. Caves, et al., IEEE Journal of Solid State Circuits, Vol. SC-14, No. 1, pages 65–73, February 1979; and "A Segmented Mu-255 Law PCM Voice Encoder Utilizing NMOS Technology" by Paul R. Gray, et al., IEEE Journal of Solid State Circuits, Vol. SC-11, No. 6, pages 740–747, December 1976, which are incorporated herein by reference. Mu-law decoders operating on 8-bit PCM code words have employed arrays of binary weighted capacitors, the total array capacitance typically being 255 times the capacitance of the smallest capacitance of the array. The capacitances of the two largest binary weighted capacitors of the array are therefore 128 and 64 times that of the smallest capacitor thereof. In integrated circuit structures, however, it is desirable to minimize the surface area of a chip that is required for individual circuit elements, especially where a codec (coder-decoder) and associated circuits such as filters are fabricated on the same chip. It is readily seen that the chip area dedicated for integrated capacitors in such an integrated decoder may be reduced by approximately 50% by deleting only one of the binary weighted capacitors. Also, many of the previously available PCM decoders of integrated circuit design are sensitive to parasitic and stray capacitance effects associated with plates of integrated capacitors and switches thereof.

An object of this invention is the provision of an improved PCM decoder.

SUMMARY OF INVENTION

In accordance with this invention, apparatus for decoding PCM code words and producing associated analog signal samples (where each word includes first, second and third code groups of one or more bits each which define the polarity, a prescribed segment, and step offset in the prescribed segment for an associated analog signal sample) comprises: first capacitor means having one and other sides thereof and a net normalized capacitance $mC_o$, where m is an integer and $C_o$ is a normalized capacitance; second capacitor means having one and other sides thereof and a capacitance $mnC_o$ that is an integral multiple of the principal number n of steps in each segment; third capacitor means having one and other sides thereof and a net normalized capacitance which is substantially $(n-1)mC_o$, and comprising a plurality of binary weighted capacitors; first switch means responsive to the first code group for impressing either a positive or negative prescribed reference voltage on a first bus line; and second switch means responsive to the second and third code groups (a) for cyclically connecting one and other sides of the first and third capacitor means to ground and to the first bus line for charging associated capacitances with the one reference voltage, and connecting one and other sides of these capacitor means simultaneously to associated sides of the second capacitor means for redistributing charge on the capacitances a number of times corresponding to one less than the segment that is designated by the second code group; (b) for subsequently first connecting one and other sides of the first and third capacitor means to ground and to either the first bus line or ground for impressing a charge on capacitances that corresponds to the step offset designated by the third code group for the next segment, and then simultaneously connecting sides of these capacitor means to associated sides of the second capacitor means for redistributing charge on capacitances; and (c) cyclically connecting both sides of the first and third capacitor means to ground, and then connecting them to associated sides of the second capacitor means for redistributing charge on the connected capacitances a number of times corresponding to segments that are above the one defined by the second code group.

DESCRIPTION OF DRAWINGS

FIG. 1 is a schematic diagram of a mu-law decoder 10 embodying this invention with switches shown in schematic form.

FIG. 3 is a schematic circuit diagram in which an FET of switch means S16 is implemented with a CMOS transfer gate.

FIG. 6 is a logic diagram of a non-overlap clock generator 83.

FIG. 8 is a schematic circuit diagram of an A-law PCM decoder embodying this invention.

FIG. 9 is a schematic circuit diagram of S19 in FIG. 8 and an associated timing circuit.

FIGS. 10 and 11 are circuit diagrams of other embodiments for controlling the polarity of the output signal.

DESCRIPTION OF PREFERRED EMBODIMENTS

Figure 2:
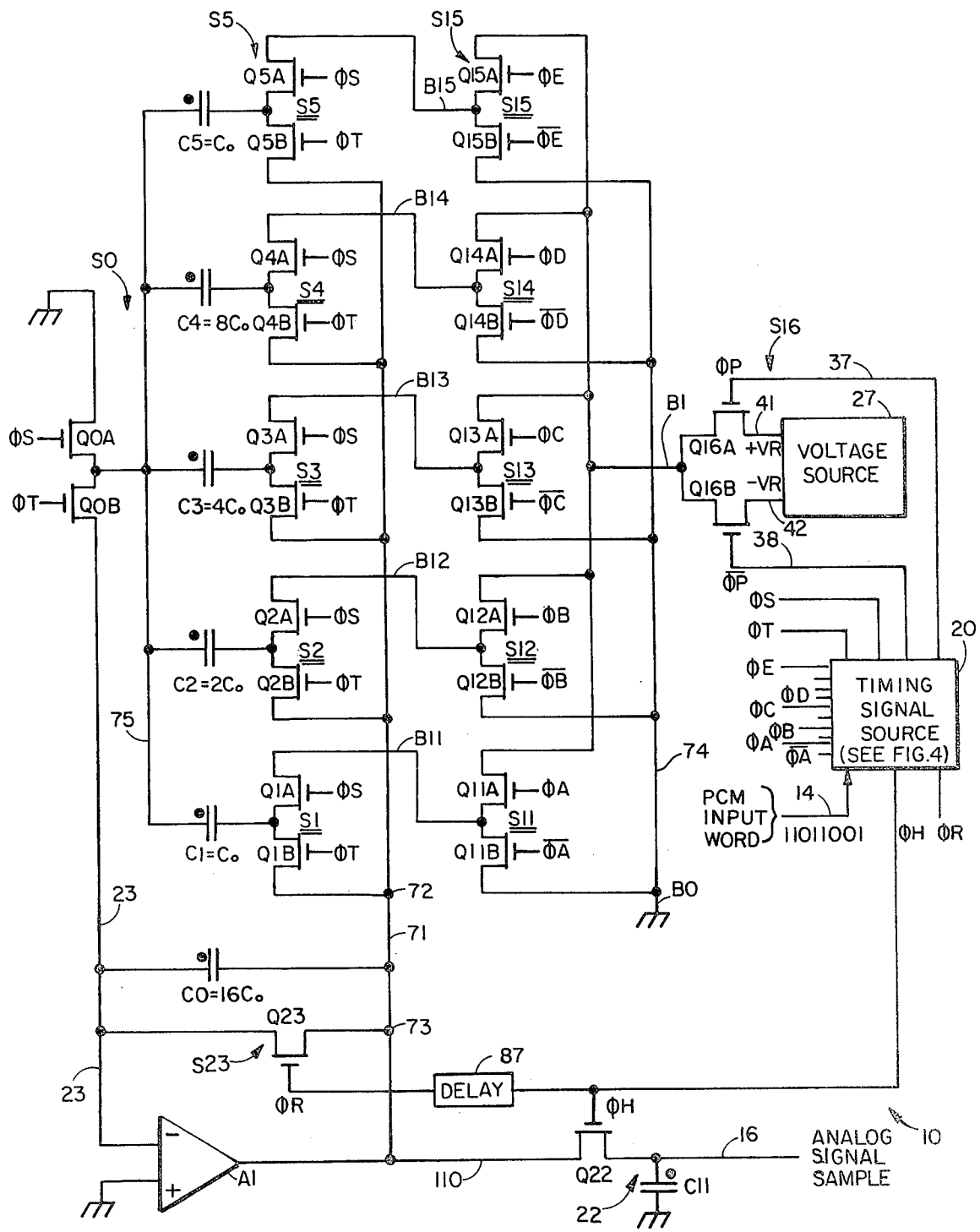
FIG. 2 is a schematic circuit diagram of the decoder 10 with switches thereof implemented with pairs of MOS FET's.

In order to maintain an acceptable signal-to-noise ratio with a minimum number of bits in a code word representing a discrete analog signal amplitude, PCM systems use non-linear coding schemes in which the quantizing increment decreases as the analog signal level or amplitude decreases. Stated differently, of the total available number of quantized values representable with a given number of bits, a more than proportionate number of bits are allocated to the smaller signal amplitudes. The segmented mu-law is possibly the best known and most widely used coding scheme in the United States. In it, the amplitude range of sampled analog signals is divided into 16 segments, 8 segments for positive analog input signal voltages and 8 segments for negative analog input signals. Each segment contains 16 steps. In the lowest segments ± zero (that are adjacent the origin and designated by S=±0), each step is a normalized unit value. In each successive segment, the step size or offset doubles: i.e., two units per step in segment one where S=1 (the binary name of the segment, rather than the position thereof with respect to the origin), four units per step in segment two, et cetera, to 128 units per step in segment seven where S=7 (the eighth segment from the origin). In order to reduce the quantizing noise for low level analog signals, the two steps adjacent to and symmetrical about the origin may be merged into a single step, with the origin at its midpoint. That is, the first steps in the segments ± zero are one-half unit high. The total number of normalized units that the magnitude of an analog signal sample is spaced from the origin is defined by $$(2^S)(16s) - 16 \qquad (1)$$

where S is the numeral corresponding to the binary name for the segment and s is the step offset within a designated segment containing the analog signal sample. Since there is a total of 256 steps (or 255 steps when the two steps adjacent the origin are merged into a single step), the PCM code word defining the analog signal sample may be an 8-bit word consisting of three code groups. The first code group is the MSB of the PCM word and designates the polarity of the associated analog signal, being a binary one for positive voltages and a binary zero for negative signal voltages. The next three bits comprise a second code word which is a binary number indicating a particular segment containing the amplitude of an associated analog input signal, with 000 representing the segment closest to the origin and 111 representing the longest segment. The last four bits or LSB's comprise a third code group designating the step offset in the designated segment for the analog input signal sample, with 0000 being the first step and 1111 designating the last step in a particular segment. This companding and compression law coding format may be modified for transmission. This does not seriously change the codec transfer characteristic. The decoding characteristic is complementary to that of the encoding law described here. The segmented A-law coding scheme is more widely used in Europe. It is similar to the mu-law coding scheme except that the steps in the first two segments are of the same height, the step height doubling in each successive segment.

Referring now to FIG. 1, the mu-law PCM decoder 10 for converting an 8-bit PCM code word on line 14 to an associated analog signal sample on line 16 is preferably implemented in fully integrated circuit form. The PCM decoder 10 comprises a first integrated capacitor C0=16Co that is connected across an operational amplifier A1 as a feedback capacitor, where Co is a normalized capacitance; a plurality of binary weighted switched capacitors C1=Co, C2=2Co, C3=4Co, and C4=8Co; a second switched capacitor C5=Co having a normalized unit capacitance Co; pluralities of switch means S0–S5 and S11–S16 for causing the switched capacitors to periodically (a) sample voltages on associated ones of the bus lines B11–B15 and (b) redistribute charge on the switched capacitors and C0; a source 20 of timing control signals for driving the switch means; and a sample-hold circuit 22 including an integrated capacitor C11 which periodically samples and holds an analog output voltage Vo of A1. The switch means S16 is operative for connecting either a + or − reference voltage (±VR) to a bus line B1. Each of the switch means S11–S15 has two positions and is operative for connecting either the ground reference potential on bus line B0 or one of the positive and negative reference voltages (±VR) on line B1 to an associated one of the bus lines B11–B15. The switch means S0–S5 have two positions and are operative for causing the switched capacitors to alternately (1) sample the voltage on an associated one of the bus lines B11–B15 and (2) connect the switched capacitors simultaneously across C0 for redistributing charge on them. The switch S22 is periodically closed for sampling the analog output voltage Vo of the amplifier. The switch S23 is normally open; closing S23 short-circuits C0 for resetting the charge on it and the voltage Vo to zero. The dots adjacent one sides of the integrated capacitors in FIG. 1 designate the top plates thereof.

The amplifier A1 is preferably an integrated differential input operational amplifier associated with a feedback capacitor C0 so as to form a voltage controlled voltage source having a very low output impedance, a very high input impedance, and providing whatever output current is demanded by external circuitry. The amplifier preferably has a very large gain and an output voltage that is the gain times the difference between the two input voltages. The top and bottom plates of the integrating or feedback capacitor C0 are connected to the inverting input and output terminals, respectively, of A1. The non-inverting input of A1 is connected to ground for impressing a virtual ground potential on its inverting input line 23. Thus, the top plate parasitic capacitance of C0 does not change the output impedance of A1 or the operation of the decoder since A1's output impedance is already substantially zero ohms. Also, the bottom plate parasitic capacitance of C0 does not affect the operation of A1 or the decoder since it is effectively connected to ground. This means that the decoder is generally insensitive to both top and bottom plate parasitic capacitance effects of C0.

In an integrated circuit embodiment of the decoder 10 that is implemented with MOS technology, the switch means comprise MOS FET transistors, see FIG. 2. The switch means S16 in FIG. 2 comprises a pair of MOS FET transistors Q16A and Q16B that are connected in series across output terminals of a voltage source 27 with their intermediate terminals connected to the bus line B1. Their gate electrodes are driven by digital control signals $\phi P$ and $\overline{\phi P}$ from source 20 which set the polarity of the associated analog signal. Alternatively, each FET transistor in FIG. 2 may be replaced with a CMOS transfer gate as is Q16A in FIG. 3 for reducing feedthrough of control signals. The switch means S11–S15 also comprise pairs of series connected MOS FET transistors that are connected between the bus lines B0 and B1, their intermediate terminals being connected to associated bus lines B11–B15. Their gate electrodes are driven by associated ones of the digital control signals $\phi A$–$\phi E$ and the complements thereof, see FIG. 5. The switch means S0–S5 also comprise pairs of series connected MOS FET transistors having gate electrodes that are driven by different ones of a pair of two-phase non-overlapping digital timing control signals $\phi S$ and $\phi T$ in FIG. 5. Associated ones of the transistors Q1A–Q5A and Q1B–Q5B are connected in series between an associated one of the bus lines B11–B15 and the output terminal of A1. Since this circuit structure switches the bottom plates of C1–C5 and the source and drain electrodes of transistors of S1–S5 between output terminals of voltage sources A1 and 27 or between the output of voltage source A1 and ground, the decoder is substantially insensitive to parasitic and stray capacitance effects associated with these electrodes of these elements. The transistors Q0A and Q0B of switch means S0 are connected in series between ground and the line 23, which has a virtual ground potential impressed upon it by the operation of A1, with their intermediate terminals connected to the top plates of C1–C5. This structure requires that the top plates of C1–C5 and the drain and source electrodes of Q0A and Q0B be alternately connected to ground and the virtual ground potential on line 23 so that the decoder is also substantially insensitive to parasitic and stray capacitance effects associated with the electrodes of these elements.

The switch means S22 and S23 comprise associated MOS FET transistors having gate electrodes responsive to control signals $\phi H$ and $\phi R$ in FIG. 5 for periodically charging C11 to the output voltage of A1 and for subsequently resetting the charge on C0 to substantially zero, as is described more fully hereinafter. Since the source and drain electrodes of Q23 are connected to either the output of a voltage source A1 or a virtual ground potential on line 23, the operation of the decoder 10 is substantially insensitive to stray capacitance effects associated with this transistor. One of the source and drain electrodes of Q22 is also connected to the output of A1 so that it has no effect on the operation of the decoder. The other one of the Q22 source and drain electrodes is connected to the top plate of C11 so that any stray capacitance associated therewith is connected in shunt with this integrated capacitor and can then be compensated for by varying the capacitance of the latter. Also, the exact value of C11 is not critical. Thus, it is seen that the decoder 10 is substantially insensitive to parasitic and stray capacitance effects associated with plates of integrated capacitors and electrodes of switching transistors thereof.

Figure 4:
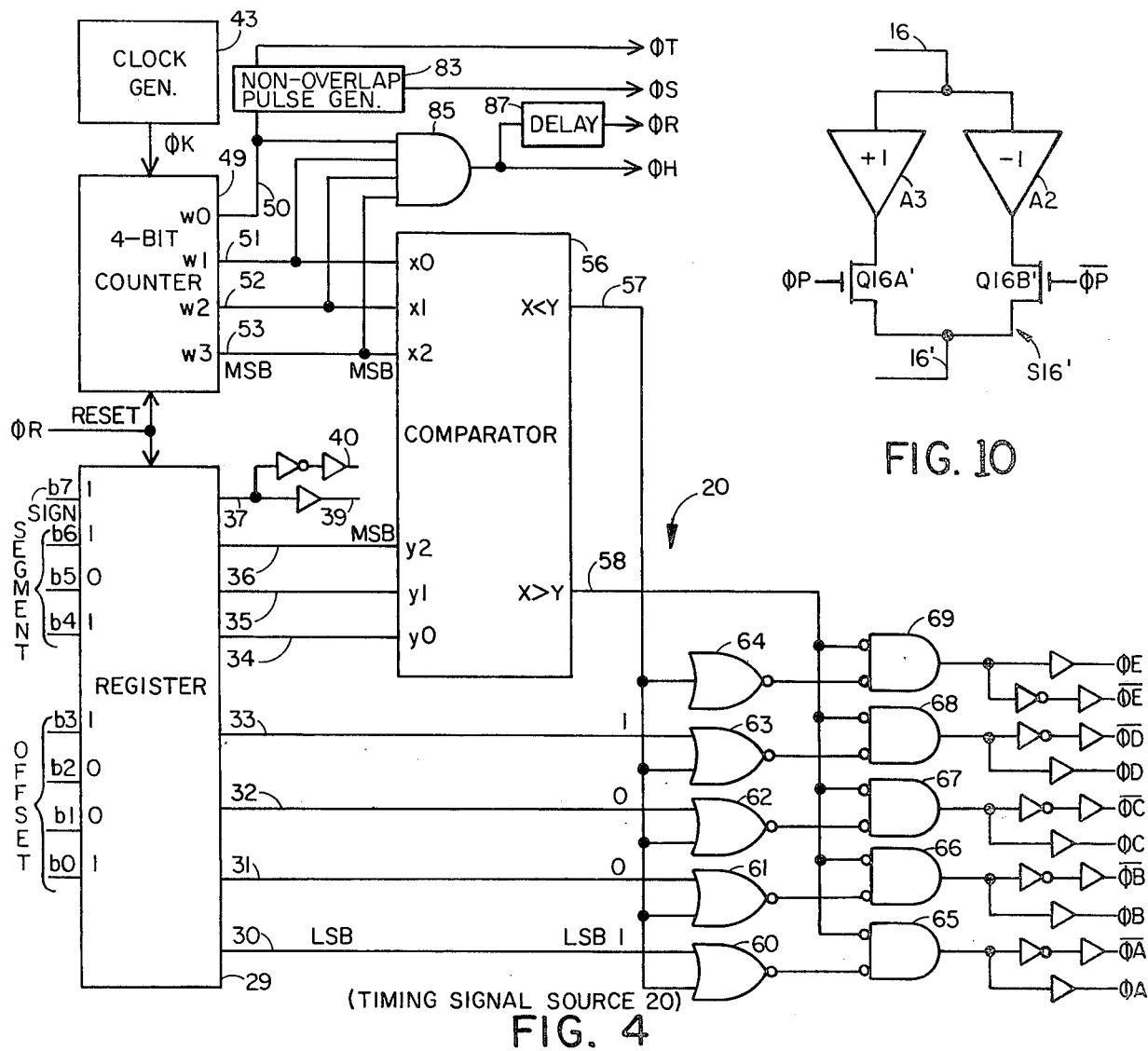
FIG. 4 is a schematic logic and block diagram of the timing signal source 20.

The timing signal source 20 in FIG. 4 essentially comprises a register 29 which is parallel loaded with bits of the PCM code word on line 14, a clock generator 43 which drives a four bit counter 49, comparator means 56 which compares the binary number specified by the second code group with that defined by the three most significant bits w3w2w1 in the output of the counter 49, and pairs of series connected NOR-gates 60–69. The gates are responsive to outputs of the comparator for selectively passing binary bits in the third code word on lines 30–33 only for a particular segment identified by the second code group. The various timing signal voltages produced by the source 20 are illustrated in waveforms in FIG. 5.

Figure 5:
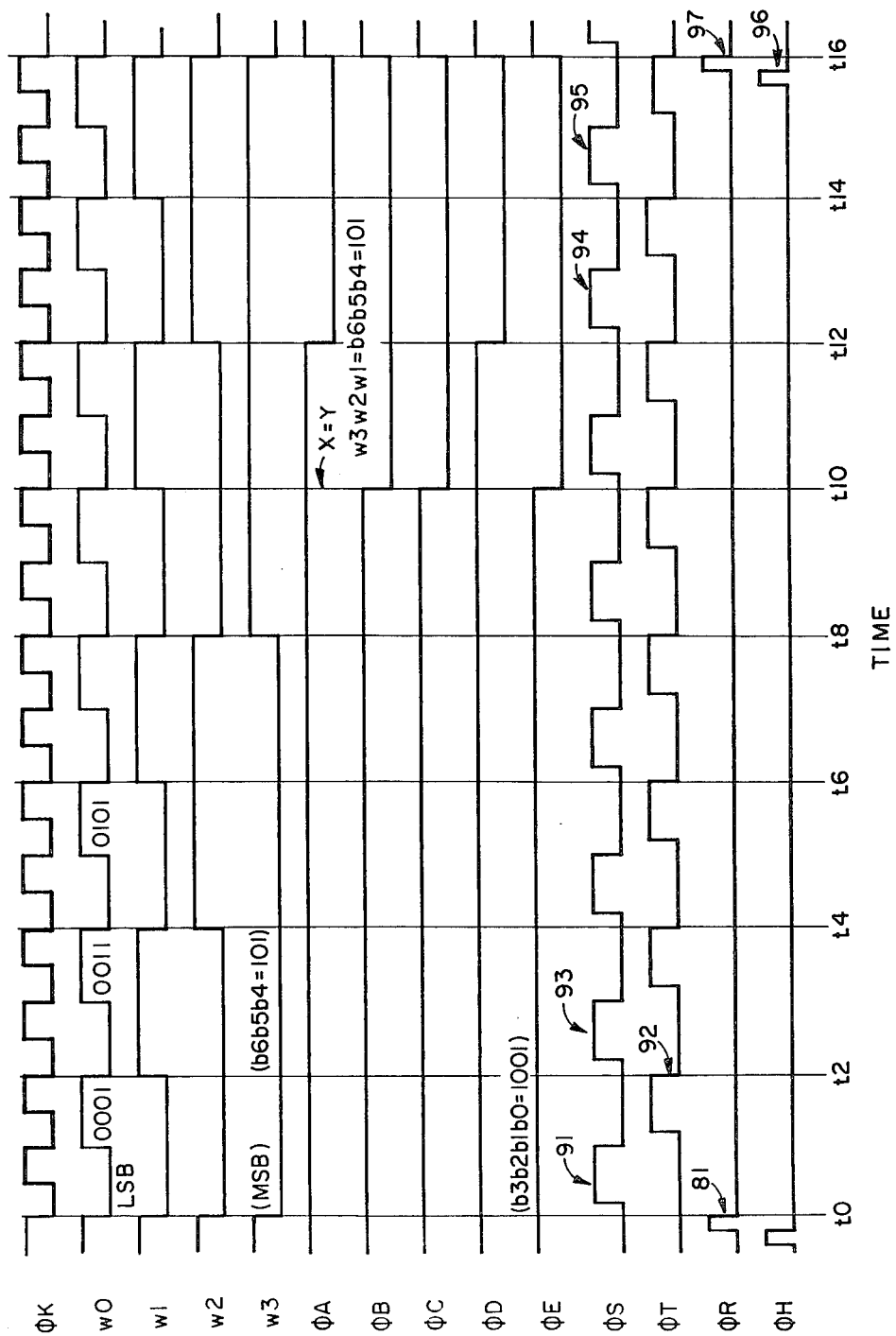
FIG. 5 is waveforms useful in describing the operation of this invention.

The shift register holds the bits in the PCM code word constant during one complete conversion cycle, between times t0 and t16 in FIG. 5. The most significant or polarity bit on line 37 and the inverse thereof are buffered onto lines 39 and 40 as $\phi P$ and $\overline{\phi P}$ which drive Q16A and Q16B, respectively, for determining whether a positive or negative reference voltage ($\pm VR$) is produced on bus line B1. The next three most significant bits on output lines 36–34 of the shift register (comprising the second code group) are applied to inputs of the comparator as a binary word $Y = y2y1y0$. The four least significant bits (the third code group) in the shift register are applied to inputs of associated NOR-gates 63–60.

The four bit counter 49 is responsive to the reset pulse 81 in $\phi R$ for resetting the contents thereof at time t0. The counter 49 is also responsive to negative going transitions in the clock signal $\phi K$ for incrementing the output thereof. The least significant bit in the output of the counter is applied to a non-overlap pulse generator 83 such as is illustrated in FIG. 6 for producing the sample and dump timing pulses in $\phi S$ and $\phi T$ that drive the switch means S0–S5. These control signals are coupled from the output terminals of NOR-gates in the circuit 83. An AND-gate 85 logically combines the output bits of the counter 49 for producing the signal $\phi H$ which drives Q22 of the sample-hold means. The signal $\phi H$ is delayed in a circuit element 87 for producing the reset signal $\phi R$ in FIG. 5.

The circuit 56 compares the binary numbers defined by the second code word $Y = y2y1y0$ and the word $X = x2x1x0$ that is defined by the three most significant bits w3w2w1 in the output of the counter 49 for producing binary signals on lines 57 and 58 indicating whether $X<Y$, $X>Y$, or $X=Y$. When X is less than Y, the comparator produces a binary 1 and 0 on lines 57 and 58 which disable the NOR-gates 60–64 for blocking passage of the third code group and impressing binary 1's onto the outputs of NOR-gates 65–69 which are connected through buffer amplifiers to Q11A–Q15A for tying all of the lines B11–B15 to bus line B1 and $\pm VR$. This causes capacitors C1–C5 to sample the voltage on B1 and redistribute the charge on C0–C5 during each time slot (such as between times t0 and t2 in FIG. 5) associated with a segment that is below the segment designated by the second code word and containing the associated analog signal. Conversely, when X is greater than Y, the converter produces a binary 0 and 1 on lines 57 and 58, the latter disabling NOR-gates 65–69 for producing binary zeros in control voltages $\phi A$–$\phi E$ for now tying all of the bus lines B11–B15 to ground. This connects both sides of the switched capacitors C1–C5 to ground during time slots such as between times t12–t14 when the output $X = w3w2w1$ of the counter designates a segment that is above the segment designated by the second code word. Only during the time slot where $X=Y$ (i.e. between times t10 and t12 in FIG. 5) does the converter produce a binary zero on both of the lines 57 and 58 for enabling the NOR-gates 60–63 and 65–68 for passing bits of the digital word in the third code group and bit positions b3–b0 in the shift register in the timing control signals $\phi D$–$\phi A$. These binary zeros on lines 57 and 58 at time t10 also cause NOR-gate 69 to produce a binary zero in the control signal $\phi E$. This means that the switches S11–S15 are driven such that a charge corresponding to the offset within a particular segment is impressed on the switched capacitors and redistributed only during the prescribed time interval between times t10 and t12 in FIG. 5 that is associated with the segment defined by the second code group and which contains the associated analog signal. As was stated previously, the counter 49 is reset and the next PCM code word entered into the shift register upon termination of the next reset pulse 97 in $\phi R$.

The operation of the decoder 10 will now be considered for the PCM coded digital input word 11011001 on line 14 during the conversion cycle starting at time t0 in FIG. 5. Considering only the input word, the MSB indicates that the polarity of the associated analog signal is positive, whereas the third and second code groups 1001 and 101, respectively, indicate that the amplitude of the analog signal corresponds to that of the ninth step in the sixth segment (which is segment 5).

The reset pulse 81 in $\phi R$ turns on Q23 immediately prior to time t0 for short circuiting C0 and resetting the charge on it to substantially 0. The negative going edge of pulse 81 also resets the counter 49 for making all of the outputs thereof a binary 0. The one-bit shift register 29 is also responsive to the reset pulse 81 for parallel loading bits b0–b7 of the input word into associated stages thereof and holding them constant on associated output lines 30–37 throughout the conversion cycle between times t0 and t16. The sign bit b7=1 and the inverse thereof are buffered onto lines 39 and 40 for causing Q16A and Q16B to be conducting and non-conducting, respectively, for connecting the voltage +VR to line B1. The four least significant bits b0–b3 on lines 30–33 are coupled to one inputs of associated NOR-gates 60–63. Since the output word W=w3w2w1=x2x1x0 of the counter is 000 between times t0 and t2, such that X<Y=101, the outputs of the comparator on lines 57 and 58 are a binary 1 and 0 for disabling gates 60–64 for blocking the offset word b3–b0 from switching transistors. This operation also causes gates 65–69 to produce a binary 1 in the timing signals $\phi A$–$\phi E$ at this time. These timing signals and the inverse thereof are buffered to transistors of S11–S15 for causing Q11A–Q15A to conduct for connecting the voltage +VR on line B1 to each of the bus lines B11–B15.

The sample pulse 91 in $\phi S$ in the time slot t0–t1 closes the upper contacts of S0–S5 (i.e. Q0A–Q5A) for connecting each of the switched capacitors C1–C5 between ground and the associated one of the bus lines B11–B15 so that they all sample the voltage +VR. The counter is responsive to the negative going transition in $\phi K$ at time t1 for causing only the LSB w0 in the output thereof to change logic levels. This terminates the sample pulse 91 and produces the positive pulse 92 in $\phi T$ which now closes the lower contacts of S0–S5 for simultaneously connecting C1–C5 in parallel with C0 for redistributing charge on them. The upper contacts of S0–S5 are again closed by the pulse 93 in $\phi S$ after time t2 for starting a new sample-redistribution cycle. The operation of the converter between times t0 and t2 impresses a charge on C0 that is associated with and corresponds to the amplitude of the first segment in the positive half of the mu-law characteristic. This operation is repeated during subsequent time slots until the time t10 when the decoder has cycled through the five time slots associated with the first five segments in the positive half of the mu-law characteristic. Consideration of this operation reveals that when S0–S5 cause associated capacitors to complete a charge sample-redistribution cycle, the previous charge voltage on C0 is divided by 2, and then ½ of the charge voltage on the sum of C1–C5 is added to it. Each time this charge-redistribution sequencing of S0–S5 is repeated, the previous charge on C0 is divided by 2. The quantity of charge transferred during each sample-redistribution cycle represents 16 steps of offset within a particular segment. In the example described so far, cycling or sequencing the switches S0–S5 for accomplishing five charge-redistribution cycles accumulates charge for five times 16 steps on C0, where each set of steps is twice the size of steps of the preceding segment because of the successive divisions by two. Thus, the voltage Vo on C0 is representable as $$Vo = \frac{\frac{VR/2 + VR}{2}}{2} + \ldots \quad (2)$$

where the charge voltage on C0 is initially zero volts.

When the counter 49 is incremented at time t10, the output bit w1 thereof again goes high for making X=w3w2w1=101 designate the sixth segment (i.e., segment five) of the conversion characteristic. Since this makes X=Y, the comparator outputs are now both 0 for enabling gates 60–69 and passing the offset word b3–b0=1001 in the timing signals $\phi D$–$\phi A$, respectively, see FIG. 5 at time t10. Since the output of gate 64 is now high, the output of gate 69 and $\phi E$ are a binary 0 at time t10. The transistors of S11–S15 are responsive to the timing signals $\phi A$–$\phi E$ and the complements thereof for impressing +VR on lines B11 and B14, and impressing the ground reference voltage on lines B12, B13 and B15. This causes C1–C5 to sample a charge voltage that is directly proportional to the offset within the sixth segment and redistribute it on C0 during the time slot t10–t12.

During the next two time slots between t12 and t16, the output of counter 49 is incremented so that X>Y. This causes the comparator output on line 58 to be a binary 1 for disabling the gates 65–69 and producing a binary 0 in each of the timing signal voltages $\phi A$–$\phi E$. This holds Q11B–Q15B on for connecting the associated bus lines B11–B15 to ground. This means that sample pulses 94 and 95 in $\phi S$ connect both sides of C1–C5 to ground. The result is that cycling of S0–S5 during the last two time slots between t12 and t16 reduces the charge on C0 by a factor of 4 for producing a charge voltage on C0 and in the output of A1 that is the magnitude of the analog signal sample for the designated PCM coded input word on line 14. Transistor Q22 conducts in response to the timing pulse 96 in $\phi H$ for causing C11 to sample the analog voltage Vo in the output of the amplifier. The transistor Q23 is responsive to the reset pulse 97 in $\phi R$ for subsequently resetting the charge on C0 to 0 and entering the next PCM digital code word into stages of the shift register prior to resetting the counter 49 at time t16.

In summary, the decoding procedure for the circuit 10 in FIG. 1 is as follows: (1) reset the charge on C0 to 0 by closing and opening S23. (2) Establish a positive or negative reference voltage ±VR on B1. (3) With B1 connected to B11–B15, toggle S0–S5 one less than the number of times designated by the binary value of the second code group. (4) With B15 connected to ground and B11–B14 connected to either B0 (ground) or B1 (VR) in the manner designated by bits of the third code group, with its MSB establishing the binary voltage on B14, toggle S0–S5 only once. (5) With B11–B15 all connected to ground, toggle S0–S5 a number of times corresponding to segments not previously considered and above that segment designated by the second code group.

In another decoder 10A (not shown) embodying this invention, the speed of the decoder is approximately doubled by increasing the speed of operation of the timing source 20 and generation of signals w0–w3 and $\phi A$–$\phi E$, and duplicating S0–S5 and C1–C5 with switches S0'–S5' of the opposite phase as S0–S5 and with the capacitors C1′–C5′ of the same values as C1–C5. In this decoder, C1–C5 sample voltages on associated bus lines B11–B15 for a sample pulse 91, for example, in φS while the capacitors C1′–C5′ are connected across C0 for redistributing charge on them. During the dump pulse 92 in φT in the next time slot t1–t2, the capacitors C1′–C5′ sample the voltages on bus lines B11–B15 while C1–C5 are connected across C0 for redistributing the charge on them.

In another embodiment of this invention, the speed of decoding is increased by simultaneously operating on a number of segments at a time. A decoder 10B (not shown) for operating on segments in pairs (i.e., two segments at a time) additionally comprises a second set of capacitors C1′–C5′ and a second set of switches S0′–S5′ and S11′–S15′. The capacitances of C1′–C5′ here are twice the capacitances of associated elements C1–C5. In this decoder, the speed of the timing source 20 is increased and caused to produce a first set of timing voltages φA–φE for even numbered segments 0, 2, etc. and a second set of timing voltages φA′–φE′ for odd numbered segments 1, 3, etc. During each cycle of adjacent pulses 91 and 92, for example, in φS and φD, S11–S15 and S11′–S15′ are responsive to associated signals φA–φE and φA′–φE′ for the least significant and most significant ones of a pair of segments (e.g. the odd and even numbered segments 0 and 1, respectively) for connecting binary voltages to associated bus lines. During a sample pulse 91, S0–S5 and S0′–S5′ connect capacitors to associated bus lines for sampling voltages thereon. In the adjacent dump pulse 92 the switches simultaneously connect all of the switched capacitors C1–C5 and C1′–C5′ across C0 for redistributing charge on C0 and capacitors of the two groups thereof. Alternatively, additional capacitor arrays for other segments or all eight segments may be employed, with the capacitances of associated capacitors in each additional array being doubled for the next higher segment. Further, the conversion speed may be made double that of the converter 10 with a single capacitor C12 (not shown) having a capacitance of 32Co, which is equal to the total capacitance of the aforementioned second binary weighted capacitor array C1′–C5′, switches S0′ and S1′ associated with opposite sides of C12 and additional logic circuitry being required for causing C12 and the switches S0′–S1′ to be associated with a full segment that does not include the step offset or end point of the associated analog signal. Alternatively, additional circuitry may be employed to reduce the capacitance of C12 an appropriate amount for an associated segment containing the end point of the analog signal voltage.

Figure 7:
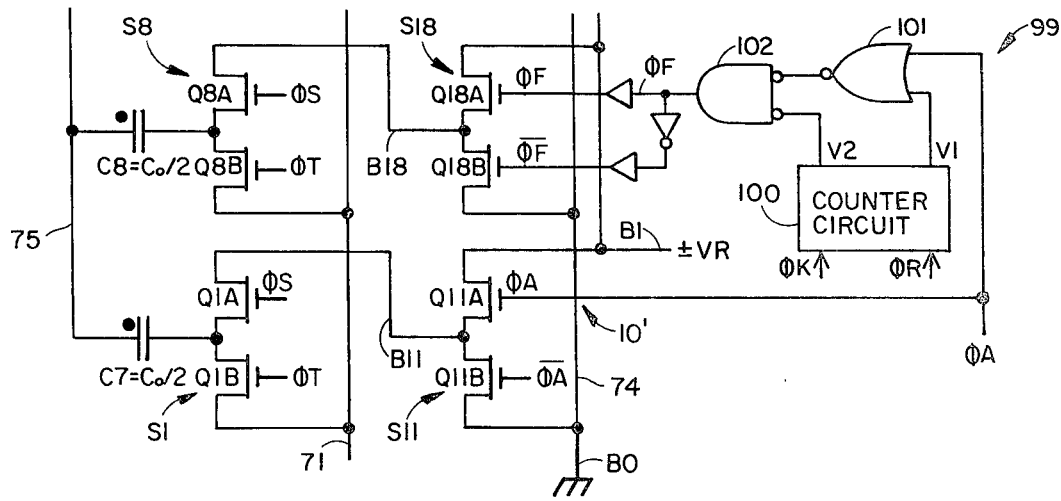
FIG. 7 is a schematic circuit and logic diagram of an embodiment providing a half step in the ± first segments that are adjacent the origin.

The decoder 10 implements a mu-law encoding characteristic in which there are 16 equal steps in each of the positive and negative segments that are adjacent the origin where Vo=0. In order to reduce quantizing noise and eliminate cyclical operation that may be caused by low level noise signals, it is desirable to have 15½ steps in the first positive and negative segments rather than 16, the half steps being adjacent the origin. The decoder 10′ in FIG. 7 accomplishes this half step spacing by effectively dividing the unit valued capacitor C1=Co in FIG. 1 into a pair of equal valued capacitors C7=C8=Co/2. The capacitor C7 replaces C1 and is associated with S1 and S11, transistors of the latter being driven by the timing signals φA and $\overline{\phi A}$. The capacitor C8 is associated with S8 and S18, the latter being responsive to control voltages φF and $\overline{\phi F}$ for connecting bus line B18 to either ground or one of ±VR.

The timing signal φF is produced by a logic circuit 99 comprising a second counter circuit 100 producing binary control voltages V1 and V2 that are applied to inputs of associated series connected NOR-gates 101 and 102. The timing signal φA is applied to the other input of gate 101. The output of gate 102 is the timing signal φF which is buffered to the Q18A gate electrode. The counter 100 is reset by each pulse in φR for causing it to count negative transitions in φK for causing V1 and V2 to be either a binary 1 or 0 during the first time slot (t0–t2) associated with the first segment and strapping these control voltages to a binary 0 at all other times. This causes the connection of the bottom plate of C8 to either ground or ±VR to be controlled by the counter 100 and associated gates only during the time slot for the first segment, the timing voltage φF being the same as the control voltage φA during all other segments when V1=V2=0.

When V2 is a binary 1, then φF is a logic 0 for connecting both sides C8 to ground during the sample interval of the first time slot. This causes C0 to accumulate a charge in the time slot for the first segment, for a segment word 000 and an offset word 0001, that corresponds to one-half that of other steps in this first segment. Thus, there is a total of 15½ steps in the first segment. Since V1 and V2 are both binary 0 in other time slots, all other segments have 16 steps. In an alternate embodiment in which V1 and V2 are a binary 1 and 0, respectively, φF is a binary 1 in the first segment for causing the origin, for second and third code words 000 and 0000, respectively, to be at +½ and −½ in the first segments. All other steps in the first segments then are unit valued such that there is a total of 16½ steps in the first segments. When V1 and V2 are both a binary zero, then φF=φA.

In the modified form of this invention in FIG. 8 for satisfying the A-law characteristic, the decoder 10 of FIG. 1 additionally comprises a switch means S19 in line 71 for selectively connecting the node 72 to ground or to the bottom plate of C0 (i.e. to the output terminal of A1). The switch S19 is similar to the switches S11–S16 and comprises a pair of MOS FETs Q19A and Q19B that are connected in series between node 73 and ground, with their intermediate terminals connected to node 72. A logic circuit 74 in FIG. 9 produces timing signals φG and $\overline{\phi G}$ which are buffered to the gate electrodes of Q19A and Q19B. The logic circuit 74 comprises a counter circuit that is reset by pulses in φR and is responsive to the subsequent negative going transition in φK at time t1 for producing a positive pulse (a binary 1) in φG only during the time interval t1–t2. Alternatively, circuit 74 may be responsive to the reset pulse 81 for maintaining φG high throughout the time interval t0–t2. Alternatively, φG=w3·w2·w1. At other times, φG is low and $\overline{\phi G}$ is high. These timing signals therefore open Q19B and close Q19A during the time interval t1–t2 (or t0–t2) for connecting the binary weighted capacitors C1–C5 between the inverting input line 23 of A1 and ground during the charge stabilization pulse 92 in φT. This causes all of the charge on C1–C5 to be transferred to C0 during the first time slot t0–t2. At all other times during a conversion cycle, Q19B conducts and Q19A is cut off for connecting node 72 to the bottom plate of C0 so that C1–C5 redistribute charge on them and C0 during subsequent time slots. This operation essentially eliminates the numeral 2 in the first fraction at the left side of equation (2). This means that the full charge accumulated on C0 during the first segment is not reduced in magnitude by a factor of 2 as it was in the decoder 10 in FIG. 1. Thus, the steps in the first and second segments for the decoder 10" in FIG. 8 are effectively the same height as is required by the A-law characteristic.

A preferred embodiment of a mu-law decoder which is believed to satisfy the CCITT specifications and/or requirements for edge step correction (i.e., step size at segment edges) as specified in the article "A Unified Formulation of Segment Companding Laws and Synthesis of Codecs and Digital Compandors" by H. Kaneko, the BELL SYSTEM TECHNICAL JOURNAL (BSTJ), September 1970, pages 1555–1588, for the Decision Level Assignment or DLA approach where the edge parameter a is 0.5 is illustrated in FIG.'s 12 and 13. As specified in Table 1 of this BSTJ article, the decoder output voltage step size at the edge points (i.e., the height of the riser for the last step in a segment) for $a=\frac{1}{2}$ is 50% larger than the size of other output voltage steps in that segment. Considering normalized values of voltage steps and the height of the output steps within the first segment being unity, then the height or size of last step in the first segment is 1.5 units. Similarly, where the second segment contains 15 additional steps having a height of two units, then the height or size of the last step in the second segment is 3 units. Stated differently, the decoder output voltage $Y_n$ is $(X_{n-1}+X_n)/2$ for $n=1, \ldots, 127,128$ where $X_{n-1}$ and $X_n$ are adjacent decision values about which $Y_n$ is centered.

Figure 12:
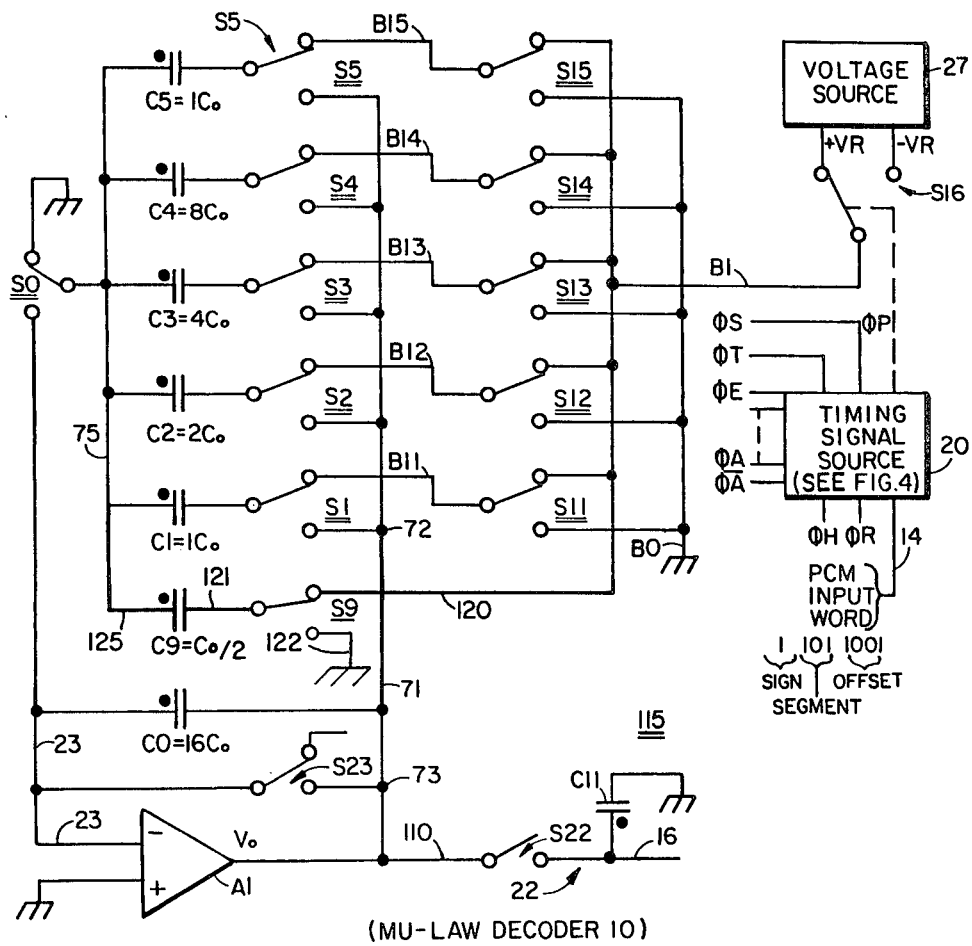
FIG. 12 is a schematic circuit diagram of an alternate embodiment of this invention for providing half step correction.

Referring now to FIG. 12, the only difference between the mu-law decoder 10 in FIG. 1 and that in FIG. 12 is the inclusion of an additional capacitor C9 and associated switch S9 in FIG. 12. The capacitor C9 has a capacitance which is one half that of the unit size capacitor C1=1Co. The top and bottom plates of C9 are connected to the movable arms of switches S0 and S9, respectively. The upper and lower contacts of S9 are connected on lines 120 and 122 to the reference voltage and ground, respectively.

Figure 13:
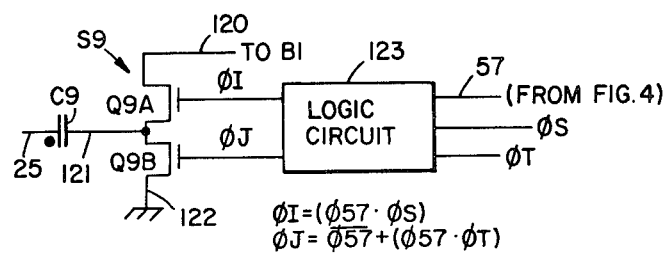
FIG. 13 is a schematic circuit diagram of S9 in FIG. 12 and an associated timing circuit 123.

Boolean expressions for timing signals $\phi I$ and $\phi J$ for driving switch S9 are shown in FIG. 13 where the signal $\phi 57=1$ corresponds to the condition where the current segment is below the prescribed segment that contains the associated analog input signal. Thus, the logic expression for $\phi I$ states that S9 connects C9 between ground and the reference voltage (line B1) during sample pulses in $\phi S$ when operation is in a segment below the prescribed segment, i.e., where $\phi 57=1$. The logic expression for $\phi J$ states that the bottom plate of C9 is (1) continuously connected to ground when operation is in the prescribed segment and in a segment that is above the prescribed segment, (i.e., $\overline{\phi 57}=1$) and (2), is connected to ground only during dump pulses in $\phi T$ when operation is in segments below the prescribed segment (for $\phi 57=1$). This means that for case (2), the charge on C9 is transferred to the parallel combination of capacitors C0–C5. Conversely, for case (1) both sides of C9 are continuously connected to ground or to a virtual ground on the inverting input terminal of A1 so that C9 is effectively removed from the circuit. This operation essentially adds an additional half of the current step size at the top of the lower of the adjacent segments which equalizes the ramp and centers decoder output voltage steps around the continuous value of the desired curve.

Consider the example where the input signal is in the third segment. Then during the sample pulses in $\phi S$ in the first two segments the capacitors C1–C5 and C9 are connected between ground and the reference voltage on line B1. During the dump or toggle pulses in $\phi T$ in the first and second segments C1–C5 are connected across C0 for redistributing charge between them and C9 is connected between ground and the top plates of C0–C5 for proportionally transferring all of the charge on C9 to C0–C5 in proportion to the capacitances thereof. In the remaining segments, both sides of C9 are preferably connected to ground for effectively removing it from the circuit. The operation of the decoder 115 is then the same as that for decoder 10 for the third through eighth segments.

Figure 10:
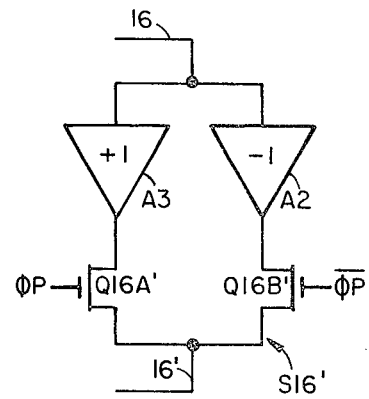

Although this invention is described in relation to preferred embodiments thereof, variations and modifications will occur to those skilled in the art without departing from the spirit of this invention. By way of example, the amplifier A1 may be omitted and the top plates of C0–C5 on the left sides of FIGS. 1 and 2 connected to ground, although the resultant decoder is then sensitive to parasitic capacitance and stray capacitance effects associated with the capacitors and switching transistors. In such a decoder, voltage follower means is preferably employed in series in line 110 for buffering the output of the decoder to external circuitry. Also, the decoders may employ different types of sample-hold circuits. Additionally, the switch means may comprise other types of switching elements such as discrete transistors, mechanical switches, relays and other types of integrated switches. Also, the decoder may be realized in IC technologies other than MOS and CMOS, in other than fully integrated circuit form, and fully or partially implemented with discrete components. Further, additional structure may be associated with C0 and A1 for compensating for the error voltage introduced by the offset voltage of A1 when it is multiplied by the ratio of $A/(1+A)$, where A is the gain of A1 as is well known in the art. Additionally, individual switches may be employed for selectively connecting the bottom plates of C1–C5 to ground instead of common switch means S0 in FIGS. 1 and 2. And the code words can be other than binary words. Also, the ground reference voltage may be a reference voltage other than zero volts. Additionally, the bus line B1 may be tied directly to either line 41 or 42 in FIG. 2 and thus to the associated reference voltage ($\pm V_R$). The polarity of the analog output signal sample on line 16 is then controlled by inverting and noninverting amplifiers A2 and A3 and transistors of a switch means S16' in FIG. 10 that are connected in associated series paths in line 16 for either inverting the sampled output voltage of A1 or passing it without inversion (see FIG. 10). Since the offset voltages introduced by A2 and A3 may not be the same magnitudes, however, care must be taken to compensate for them. Alternatively, apparatus for controlling the polarity of an analog output signal sample may be combined with a storage capacitor C11' as is illustrated in FIG. 11. Boolean expressions defining the control signals that drive different ones of the series switches S31–S32 and S33–S34 control sampling of $V_o$ by C11' when the sign bit is positive ($\phi p=1$) and negative, respectively, whereas S32 and S35 control connection of C11' to A4 in both instances. Additionally, the timing signals $\phi I$ and $\phi J$ for driving transistors of the switch S9 in FIG.'s 12 and 13 may be modified so as to charge C9 and transfer all charge on it to the parallel combination of C0–C5 only for the prescribed segment containing the input signal. Alternatively, edge step correction may be provided for only some of the segments that are below the prescribed segment with appropriate modification of $\phi I$ and $\phi J$. Further, C9 may have a unit capacitance C0 for causing the step size at the tops of adjacent segments to be 100% larger than it was in the associated lower order segment, so that this edge step is the same size as steps in the associated higher order segment. This corresponds to the case where a=1 in the BSTJ article (infra). Additionally, both Q9A and Q9B may be cut off for leaving the bottom plate of C9 floating during operation for segments in and above the prescribed segment. The scope of this invention is therefore to be determined from the appended claims rather than from the aforementioned detailed descriptions of preferred embodiments.

What is claimed is:

1. Apparatus for decoding PCM code words and producing associated analog signals, each word including first, second and third code groups of one or more binary bits each which define the polarity, prescribed segment, and step offset within the prescribed segment for an associated analog signal sample, said apparatus comprising:

first capacitor means having one and other sides thereof and having a net normalized capacitance C1=mCo, where m is an integer and Co is a normalized capacitance;

second capacitor means having one and other sides thereof and having a capacitance C2=nmCo, that is an integral multiple of the principal number n of steps within each segment;

third capacitor means having pluralities of one and other sides thereof and having a total-net normalized capacitance which is substantially Cs=nmCo−mCo=(n−1)mCo;

first means for impressing one of a positive and negative prescribed reference voltage on a first bus line; and first switch means responsive to the second and third code groups (a) for cyclically connecting one and other sides of said first and third capacitor means to a ground reference voltage and said first bus line, respectively, for charging the associated capacitances with the one prescribed reference voltage, and connecting said one and other sides of said first and third capacitor means simultaneously to associated sides of said second capacitor means for redistributing charge on said capacitances a first prescribed number of times (which may be zero) associated with a segment that is designated by the second code group; (b) for subsequently first connecting said one and other sides of said first and third capacitor means to ground and to ones of said first bus line and ground, respectively, so as to impress a charge on capacitances of said first and third capacitor means that corresponds to the step offset designated by the third code group in the prescribed segment designated by the second code group, and then simultaneously connecting said one and other sides of said first and third capacitor means to associated sides of said second capacitor means for redistributing charge on capacitances thereof; and (c) subsequently cyclically connecting said one and other sides of said first and third capacitor means both to ground, and then connecting said one and other sides of said first and third capacitor means to associated sides of said second capacitor means for redistributing the charge on the connected capacitor means a number of times corresponding to segments that are above the prescribed segment specified by the second code group and containing the step offset defined by the third code group.

2. Apparatus according to claim 1 wherein said first switch means connects both sides of said first capacitor means to ground for the prescribed segment during connection of sides of said third capacitor means at (b) for impressing a charge thereon corresponding to the step offset designated by the third code group.

3. Apparatus according to claim 2 comprising sample-hold means periodically operative for sampling and holding the charge voltage on said second capacitor means obtained from a redistribution of the charge on said capacitor means for the most significant segment.

4. Apparatus according to claim 3 comprising second switch means responsive to the first code group designating the sign of the associated analog signal for controlling the sense of the analog output signal sample.

5. Apparatus according to claim 4 wherein said second switch means comprises said first means which is responsive to the first code group for impressing one of the positive and negative reference voltages on said first bus line for prescribing the sign of the associated output analog signal sample.

6. Apparatus according to claim 4 wherein said second switch means is responsive to the first code group for performing one of the functions of inverting the signal sample and passing without inversion the signal sample held by said sample-hold means for fixing the sign of the associated analog signal sample.

7. Apparatus according to claim 4 including third switch means operative subsequent to redistribution of charge on said capacitors for the nth segment for resetting the charge voltage on said second capacitor means prior to receipt of the next PCM word.

8. Apparatus according to claim 2 comprising differential input operational amplifier means having a non-inverting input electrically connected to ground for impressing a virtual ground potential on an inverting input terminal thereof, said inverting input terminal and an output terminal thereof being connected to one and other sides of said second capacitor means for causing them to operate as a voltage source and wherein said prescribed voltage is an output voltage of a voltage source.

9. Apparatus according to claim 8 wherein said capacitor means comprise integrated capacitors and their one and other sides are the top and bottom plates thereof.

10. Apparatus according to claim 4 wherein said third capacitor means comprises a first plurality of binary weighted capacitor means having capacitances $2^i mCo$, where i=0, 1, 2, etc.

11. Apparatus according to claim 4 wherein said third capacitor means comprises a first plurality of binary weighted capacitor means C11, C12, C13 and C14 having one and other sides thereof and having normalized capacitances mCo, 2mCo, 4mCo and 8mCo, respectively, and having a net capacitance Cs=(n−1)mCo=15mCo, where n=16 and m<n; said first switch means (a) cyclically connecting one and other sides of each of said first plurality of binary weighted capacitor means and said first capacitor means to ground and said first bus line for charging the associated capacitor means, and simultaneously connecting the one and other sides of said first plurality of capacitor means and said first capacitor means to associated sides of said second capacitor means for redistributing charge on the capacitances a number of times associated with a segment that is designated by a second code group; (b) subsequently connecting one and other sides of said first plurality of capacitor means to ground and to ones of ground and the one prescribed reference voltage in a manner designated by binary bits in associated bit positions in the third code group for impressing a binary valued charge voltage on said first plurality of capacitor means corresponding to the step offset designated by the third code group, and then connecting the one and other sides of said first plurality of binary weighted capacitor means to associated sides of said second capacitor means for redistributing charge on capacitances thereof; and (c) then cyclically connecting the one and other sides of said first plurality of capacitor means and first capacitor means both to ground, and to associated sides of said second capacitor means for redistributing charge on capacitances thereof a number of times corresponding to the number of segments that are above that designated by the second code group, and which are above the prescribed segment associated with the step offset defined by the third code group.

12. Apparatus according to claim 11 wherein $m=1$; said third code group comprises a 4-bit binary word; said first capacitor means comprises a capacitor having a capacitance $C_o$; said second capacitor means comprises a capacitor having a capacitance of $16C_o$; and said third capacitor means comprises four binary weighted capacitors having capacitances of $C_o$, $2C_o$, $4C_o$ and $8C_o$, where $C_o$ and $8C_o$ here are associated with the LSB and MSB, respectively, of the third code group.

13. Apparatus according to claim 11 wherein: said third code group comprises a 4-bit binary word; $m=2$ for causing said binary weighted capacitor means C11 that is associated with the LSB of the third code group to have a net normalized capacitance $C11=2C_o$; said capacitor means C11 comprises first and second capacitors each having one and other sides thereof and each having a capacitance $C_o$; said first switch means is operative for connecting one and other sides of said first capacitor in the same manner previously prescribed for said binary weighted capacitor means; said first switch means is operative only for a first segment for an associated input word for connecting one and other sides of said second capacitor to ground and to one of ground and the one prescribed reference voltage for producing a half step adjacent the origin that is one half the magnitude of other steps in the first segment; said first switch means connecting said second capacitor in parallel with said first capacitor for operation associated with all other segments.

14. Apparatus according to claim 13 wherein said first switch means connects both one and other sides of said second capacitor to ground in the sampling interval for a first segment for an associated input word.

15. Apparatus according to claim 11 further comprising fourth capacitor means having a capacitance $2mC_o$ and fifth capacitor means comprising a second plurality of binary weighted capacitor means each having one and other sides thereof and having normalized capacitances of $2mC_o$, $4mC_o$, $8mC_o$, and $16mC_o$, said second plurality of binary weighted capacitor means having a total-net capacitance of $Ct=2(n-1)mC_o=30mC_o$; said first switch means causing said first and third and said fourth and fifth capacitor means to simultaneously operate in the same manner as previously prescribed for charge associated with pairs of segments in the ascending order of the position thereof; said first switch means further causing said first and third capacitor means to be associated with charge for even numbered segments 0, 2, 4, etc. and for causing said fourth and fifth capacitor means to be associated with charge for odd numbered segments 1, 3, 5, etc.

16. Apparatus according to claim 11 further comprising fourth capacitor means having a capacitance $mC_o$ and fifth capacitor means which is a second plurality of binary weighted capacitors having capacitances of $mC_o$, $2mC_o$, $4mC_o$, and $8mC_o$, and a net normalized capacitance which is also substantially $(n-1)mC_o=15mC_o$; said first switch means causing said first and third capacitor means to be connected for sampling and redistributing charge for one segment while it connects said fourth and fifth capacitor means for redistributing and sampling charge associated with an adjacent segment so as to cause said first and third capacitor means and said fourth and fifth capacitor means together to alternately operate for adjacent segments for increasing the conversion rate.

17. The method of decoding PCM code words for producing associated analog signals, each word including first, second, and third code groups of one or more bits each defining the polarity, segment, and offset within a prescribed segment for an associated analog signal sample, comprising the steps of:

impressing one of a positive and negative prescribed reference voltage on a first bus line;

first cyclically connecting one and other sides of a first capacitor means (having a net normalized capacitance $C1=mC_o$, where m is an integer and $C_o$ is a normalized unit capacitance) and a second capacitor means (having a total-net normalized capacitance which is substantially $Cs=nmC_o-mC_o=(n-1)mC_o$, where n is the principal number of steps within each segment) to ground and the first bus line for charging the associated capacitances with the one of the positive and negative prescribed reference voltages, and connecting one and other sides of the first and second capacitor means simultaneously to associated sides of a third capacitor means (having a capacitance $C3=mnC_o$, that is an integral multiple of the principal number n of steps within each segment) for redistributing charge on the capacitances a first prescribed number of times associated with a segment that is designated by the second code group;

second connecting both sides of the first capacitor means to ground and one and other sides of the second capacitor means to ground and ones of the first bus line and ground so as to impress a charge on capacitances of the latter that corresponds to the step offset designated by the third code group in the next higher prescribed segment designated by the second code group;

third connecting the one and other sides of the first and second capacitor means to associated sides of the third capacitor means for redistributing charge on capacitances thereof;

fourth cyclically connecting both one and other sides of the first and second capacitor means to ground, and connecting them to associated sides of the third capacitor means for redistributing charge on the connected capacitances a number of times corresponding to the segments that are above the prescribed one designated by the second code group and containing the step offset defined by the third code group; and periodically coupling an analog signal sample from the third capacitor means.

18. The method according to claim 17 including the additional step of causing the polarity of the analog signal coupled from the third capacitor means to have a polarity prescribed by the first code group.

19. The method according to claim 18 wherein the last named step comprises impressing one of a positive and negative reference voltage on the first bus line in accordance with the sign of the associated analog signal as designated by the first code group.

20. The method according to claim 18 wherein the last named step comprises performing one of the steps of inverting the periodically coupled analog signal and passing a noninverted coupled analog signal in accordance with the sign of the associated analog signal as designated by the first code group.

21. The method according to claim 18 including the additional step of connecting the inverting input terminal and an output terminal of a differential input operational amplifier means, having a non-inverting input that is electrically connected to ground for impressing a virtual ground potential on the inverting input terminal thereof, to one and other sides of the third capacitor means for causing it to operate as a voltage source.

22. The method according to claim 21 including the additional step of producing the prescribed reference voltages as output voltages of a voltage source.

23. The method according to claim 22 wherein the capacitor means comprise integrated capacitors with their one and other sides being the top and bottom plates thereof for providing a method of producing an analog signal sample which is substantially insensitive to parasitic and stray capacitance effects associated with integrated capacitors and transistor switch means thereof.

24. The method according to claim 18 wherein the second capacitor means comprises a plurality of binary weighted capacitor means, each having one and other sides thereof and having normalized capacitances such as mCo, 2mCo, 4mCo and 8mCo; said second connecting step comprising the steps of connecting one and other sides of the plurality of capacitor means to ground and to one of ground and the one prescribed reference voltage in a manner designated by binary bits in associated bit positions of a binary word in the third code group for impressing a charge voltage on the plurality of capacitor means corresponding to the step offset designated by the third code group, and then connecting the one and other sides of the plurality of binary weighted capacitor means and the first capacitor means to associated sides of the third capacitor means for redistributing charge on capacitances thereof.

25. The method according to claim 24 including the additional step of resetting the charge on the third capacitor means to substantially zero subsequent to redistribution of the charge on the capacitors for the nth segment and prior to receipt of the next PCM coded input word.

26. The method according to claim 21 wherein said coupling step comprises sampling and holding the output voltage of the amplifier means for a charge on the capacitor means obtained from a redistribution of charge on the capacitor means for the most significant segment defining the associated analog signal sample and prior to said step of resetting the charge on the third capacitor means.

27. The method according to claim 18 wherein m=2 and the smallest binary weighted capacitor means that has a capacitance C11=2Co comprises first and second capacitors each having a capacitance Co; and including the additional steps of connecting one and other sides of the first capacitor in the same manner previously prescribed for binary weighted capacitor means; connecting both sides of the second capacitor to ground in only a first segment for an associated input word for producing a half step adjacent the origin that is one-half the magnitude of other steps in the first segment; and connecting the second capacitor in parallel with the first capacitor for operation associated with other segments.

28. Apparatus according to claim 8 further comprising fourth capacitor means having one and other sides thereof and having a net normalized capacitance C4=mCo/p, where p is a positive non-zero number; said first switch means being operative during (a) above for cyclically connecting one and other sides of said fourth capacitor means to ground and to said first bus line, respectively, for charging said fourth capacitor means with the prescribed reference voltage, and then connecting one and other sides of said fourth capacitor means to the one side of said second capacitor means and ground, respectively, for transferring all charge on said fourth capacitor means to the parallel combination of said other capacitor means a second prescribed number of times (which may be zero).

29. Apparatus according to claim 28 wherein p=1.

30. Apparatus according to claim 28 wherein p=2.

31. Apparatus according to claim 28 wherein said second prescribed number is less than or equal to said first prescribed number.

32. Apparatus according to claim 28 wherein said first prescribed number designates the segment immediately prior to the prescribed segment.

33. Apparatus according to claim 32 wherein said second prescribed number is equal to said first prescribed number.

34. Apparatus according to claim 33 wherein said first switch means essentially connects opposite sides of said fourth capacitor means to a ground reference potential during the prescribed segment and segments above the prescribed segment.

35. Apparatus according to claim 34 wherein said first switch means essentially connects opposite sides of said fourth capacitor means both to ground or to ground and the virtually grounded input terminal of said amplifier means during the prescribed segment and segments above the prescribed segment.

36. The method according to claim 21 wherein said first connecting step further comprises the step of cyclically connecting one and other sides of a fourth capacitor means having a net normalized capacitance C4=mCo/p, where p is a positive non-zero number, to ground and the first bus line, respectively, for charging said fourth capacitor means with the prescribed reference voltage, and connecting said one and other sides of said fourth capacitor means to the one side of said third capacitor means and ground, respectively, in synchronism with connection of said first and third capacitor means, for transferring all charge on said fourth capacitor means to the parallel connected capacitor means a second prescribed number of times.

37. The method according to claim 36 wherein p=1.

38. The method according to claim 36 wherein p=2.

39. The method according to claim 36 wherein said second prescribed number is equal to said first prescribed number.

40. The method according to claim 39 wherein said first prescribed number designates the segment immediately prior to the prescribed segment.

41. Apparatus according to claim 8 further comprising fourth capacitor means having one and other sides thereof and having a net normalized capacitance $C4=mCo/p$, where p is a positive non-zero number; said first switch means being operative during (b) above for connecting one and other sides of said fourth capacitor means to ground and to said first bus line, respectively, for charging said fourth capacitor means with the reference voltage, and then connecting one and other sides of said fourth capacitor means to the one side of said second capacitor means and ground for transferring all charge on said fourth capacitor means to the parallel combination of said other capacitor means only during the prescribed segment.

* * * * *